United States Patent [19]

Gottwald et al.

[11] Patent Number: 4,870,371

[45] Date of Patent: Sep. 26, 1989

[54] NETWORK FOR CASCADE COMPENSATION OF THE NON-LINEARITY OF AN AMPLIFIER

[75] Inventors: Alfons Gottwald, Sachrang; Hermann Ens, Unterföhring, both of Fed. Rep. of Germany

[73] Assignee: Rohde & Schwarz GmbH & Co. KG, Fed. Rep. of Germany

[21] Appl. No.: 225,575

[22] Filed: Jul. 27, 1988

Related U.S. Application Data

[63] Continuation of Ser. No. 42,665, Apr. 27, 1987, abandoned.

[30] Foreign Application Priority Data

May 2, 1986 [DE] Fed. Rep. of Germany ....... 3614785

[51] Int. Cl.[4] .............................................. H03F 1/32
[52] U.S. Cl. .................................... 330/149; 328/163
[58] Field of Search ............... 330/149, 151; 328/163; 332/18, 37 R; 455/50, 63, 65, 295

[56] References Cited

U.S. PATENT DOCUMENTS 3,732,502  5/1973  Seidel .................................. 330/149

Primary Examiner—James B. Mullins
Attorney, Agent, or Firm—Hill, Van Santen, Steadman & Simpson

[57] ABSTRACT

A network for compensating the non-linearity of an amplifier has an auxiliary network provided either before or behind said amplifier.

This network comprises
- a first branch for transferring the input signal linearly and with the amplification factor 1 from a branch point to an adder;
- a second branch comprising at least one cascade network which is composed of the cascade circuit of a circuit component having a transfer function corresponding to the quadratic transfer function of the compensated amplifier and of a circuit component having a transfer function corresponding to the inverse linear component of the transfer function of the compensated amplifier;
- and/or a third branch comprising a cascade network composed of the cascade circuit of a circuit component having a transfer function corresponding to the cubic component of the frequency-dependent transfer function of the compensated amplifier and of a circuit component having a transfer function corresponding to the inverse linear component of the frequency-dependent transfer function of the compensated amplifier.

28 Claims, 6 Drawing Sheets 4,870,371

NETWORK FOR CASCADE COMPENSATION OF THE NON-LINEARITY OF AN AMPLIFIER

This is a continuation of application Ser. No. 042,665, filed Apr. 27, 1987, now abandoned.

BACKGROUND OF THE INVENTION

1. Field of the Invention

The invention is directed to a network for compensating the non-linearity of an amplifier in accordance with the preamble of the main claim.

2. Description of the Prior Art

Cascade compensation networks of this type are known (DE-OS Nos. 2,140,851 and 2,306,294). Due to the auxiliary network, which is cascaded either before or behind the amplifier, the signal to be amplified is pre-distorted or, respectively, post-distorted as far as possible exactly inversely to the non-linear distortions of the amplifier, so that the distortions caused by the amplifier are compensated. FIG. 1 shows the basic circuit diagram for such a cascaded compensation network with the auxiliary network A disposed before the amplifier B. The amplifier B has a frequency-dependent non-linear transfer function with a linear component $H_{1b}(\omega)$, a quadratic component $H_{2b}(\omega_1, \omega_2)$ and a cubic component $H_{3b}(\omega_1, \omega_2, \omega_3)$. The auxiliary network is composed, for instance, of three branches 1, 2, 3 which are connected in parallel between a branch point 4 and an adder 5. Mostly, branch 1 connects the branch point 4 directly to the adder 5; for compensation of the quadratic distortions a circuit component $H_{2a}$ is arranged in branch 2 by which the input signal X is distorted quadratically and is inversely supplied to the adder 5. For compensating cubic distortions, a corresponding circuit component $H_{3a}$ may be arranged in the branch 3 for cubically distorting the input signal X and again supplying it inversely to the adder 5. With the known auxiliary networks the circuit components $H_{2a}$ and $H_{3a}$ are components such as diode or resistance networks the transfer functions of which approximately correspond at only one frequency to the corresponding quadratic or cubic characteristic of the amplifier B at the same frequency; moreover, in the known networks additional phase shifters are frequently provided in the branches 2 and 3 by means of which the desired matching of the characteristics between the auxiliary network A and the amplifier B can be adjusted exactly for only one selected frequency. Therefore the known auxiliary networks are only narrow-band solutions, while broadband compensation of the non-linearities of such an amplifier within a broad transmission frequency band is not possible with the known auxiliary networks.

SUMMARY OF THE INVENTION

It is therefore the object of the invention to provide a cascaded compensation network for broadband amplifiers and other frequency-dependent non-linear transmission systems, which permits compensation of the non-linearities of such an amplifier or transmission system within a broad frequency band.

Proceeding from a network as specified in the preamble of the main claim, this object is solved by the characterizing features thereof. Advantageous further modifications will be apparent from the subclaims.

In the network of the invention, the auxiliary network is composed exclusively of circuit components whose frequency-dependent transfer functions ideally are identical at all frequencies, but at least always within the entire transmission frequency band of the compensated amplifier, to the corresponding frequency-dependent transfer functions of the compensated amplifier, wherein both the quadratic and the cubic compensation branch each comprises additionally a circuit component which likewise corresponds in broadband-fashion to the inverse linear component of the frequency-dependent transfer function of the compensated amplifier throughout the entire transmission frequency band. In accordance with the invention elementary basic networks are shown for the first time by means of which an auxiliary network for compensating the non-linearities of an amplifier can be composed in modular fashion from given circuit components which enable such broadband compensation within the entire transmission frequency band of the amplifier. The data required for dimensioning the individual network components of the auxiliary network for the linear, the quadratic and the cubic components of the frequency-dependent transfer function of the compensated amplifier, inclusive of the associated convolution operation in the frequency range, can either be calculated in a manner known per se (e.g. in accordance with H. J. Butterweck, "Frequenzabhängigkeit nichtlinearer Übertragungssysteme", AEÜ 21, 1967, pp.239–254) or they can be derived and determined directly by measurements from the amplifier to be compensated. In this way it is possible to compensate, for instance, the broadband power amplifier of a television transmitter so that it has extremely linear amplifying characteristics in a broad frequency band. The structure becomes especially simple when amplifying elements such as transistors and the like are incorporated in the auxiliary network, which are of the same structure as the corresponding amplifying elements of the compensated amplifier. Since the linear transfer factor of the auxiliary network can be freely chosen, the auxiliary network itself may also be designed as a broadband preamplifier.

BRIEF DESCRIPTION OF THE DRAWINGS

Below, the invention will be described in detail with reference to embodiments thereof and to schematic drawings.

DESCRIPTION OF THE PREFERRED EMBODIMENTS

Figure 1:
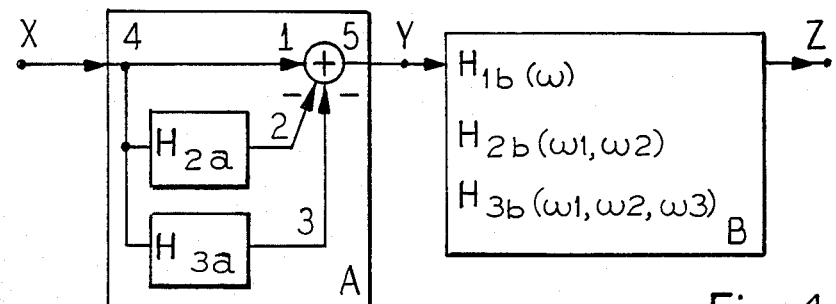
FIG. 1 is an illustration of the basic circuit diagram for a cascaded compensation network having an auxiliary network connected to the input of an amplifier.

The following description distinguishes basically between two cases. In case 1, the auxiliary network A is provided before the compensated amplifier B as shown in FIGS. 2, 4, 6, 7, 11, whereas in case 2 the auxiliary network A is provided behind the compensated amplifier B as shown in FIGS. 3, 5, 8, 9 and 10. Case 1 is mainly used for output amplifier circuits, while case 2 is used for input amplifier circuits.

In the following equations and figures, the index a refers to the association with the auxiliary network A, whereas the index b refers to the association with the compensated amplifier B.

The term "linear, quadratic or cubic component of the frequency-dependent transfer function of the compensated amplifier" as used herein is intended to mean the corresponding transfer function at all possible frequencies, but at least at all those frequencies which are within the transmission frequency band of the compensated amplifier B and, if possible, also the frequencies above and below the frequency limits of said frequency band. The transfer functions of the amplifier B, which in this way are determined in broadband fashion and, ideally, at all frequencies, are referenced $H_{1b}(\omega)$, $H_{2b}(\omega_2, \omega_2)$ and $H_{3b}(\omega_1, \omega_2, \omega_3)$, respectively, as illustrated also in FIGS. 2 and 3; in the other FIGS. 4 to 11 the term $(\omega)$ for indicating the broadband has been omitted for simplicity's sake although here, too, in contrast to the known narrow-band solution shown in FIG. 1 the corresponding circuit components are correspondingly matched with the transfer functions of the amplifier B at all frequencies at least within the frequency band of the amplifier B.

A non-linear frequency-dependent transmission system may be described by a Volterra series in the time domain. A description in the frequency domain is possible according to Chua, L. O.; Ng, C. Y.: "Frequency domain analysis of nonlinear systems: General theory", IEE J. Electronic Circuits and Systems, vol. 3, No. 4, 1979, by the Fourier transforms of the terms of this Volterra series $H_{1b}(\omega)$, $H_{2b}(\omega_1, \omega_2)$, $H_{3b}(\omega_1, \omega_2, \omega_3)$ ... The spectrum $Y(\omega)$ of the output signal of a frequency-dependent non-linear system results in dependency on the input spectrum $X(\omega)$ as follows:

$$Y(\omega)=H_1(\omega)\cdot X(\omega)+H_2(\omega_1,\omega_2)\cdot(X(\omega)*X(\omega))+H_3(\omega_1,\omega_2,\omega_3)\cdot(X(\omega)*X(\omega)*X(\omega))+\ldots \quad (1)$$

Here, "*" is the symbol of convolution: it requires the convolution of the participating parameters in the frequency range. $\omega$, $\omega_1$, $\omega_2$, $\omega_3$ are understood to be variable radian frequencies. The three summands $H_{1b}(\omega)$, $H_{2b}(\omega_1, \omega_2)$ and $H_{3b}(\omega_1, \omega_2, \omega_3)$ of the output spectrum are designated as linear, quadratic and cubic components of the transfer functions of the frequency-dependent non-linear system. In practical systems, higher than third-order non-linearities can normally be neglected. For the realization of the auxiliary network according to the invention therefore only quadratic and cubic non-linearities will be considered; all embodiments are illustrated only up to the third term. By the cascade connection of two non-linear frequency-dependent transmission systems according to FIG. 1 there result for the overall transfer function from X to Z (e.g. according to K. Fastenmeier: "Die Frequenzabhängigkeit nichtlinearer Vorgänge in Transistorschaltungen", doctoral thesis Munich Technical University, 1974): for the linear component of the transfer function:

$$H_1(\omega_1)=H_{1a}(\omega_1)\cdot H_{1b}(\omega_1); \quad (2)$$

for the quadratic component of the transfer function:

$$H_2(\omega_1,\omega_2)=H_{2a}(\omega_1,\omega_2)\cdot H_{1b}(\omega_1+\omega_2)+H_{1a}(\omega_1)\cdot H_{1a}(\omega_2)\cdot H_{2b}(\omega_1,\omega_2); \quad (3)$$

for the cubic component of the transfer function:

$$H_3(\omega_1,\omega_2,\omega_3) = H_{3a}(\omega_1,\omega_2,\omega_3)\cdot H_{1b}(\omega_1+\omega_2+\omega_3) + \quad (4)$$

$$H_{1a}(\omega_1)\cdot H_{1a}(\omega_2)\cdot H_{1a}(\omega_3)\cdot H_{3b}(\omega_1,\omega_2,\omega_3) +$$

$$\frac{1}{3}\sum_{\xi,\eta,\delta}^{3} H_{1a}(\omega_\xi)\cdot H_{2a}(\omega_\eta,\omega_\delta)\cdot H_{2b}(\omega_\xi,\omega_\eta+\omega_\delta); \quad \sum_{\xi,\eta,\delta}^{3}$$

means that in the three summands $\epsilon$, $\eta$ and $\delta$ permutatingly adopt the values 1, 2 and 3.

The invention proceeds from the following considerations: To prevent the cascade network of the two systems A and B from causing any quadratic distortions, the condition $$H_2(\omega_1,\omega_2)=0 \quad (5)$$

must be satisfied. Thence, the elementary conditions for the broadband compensation of quadratic distortions as specified in equations (7) and (9) have been obtained. To prevent the cascade network of the two systems A and B from causing any cubic distortions, the condition $$H_3(1, 2, 3)=0 \quad (6)$$

must be satisfied. Thence, the elementary conditions for the broadband compensation of cubic distortions as specified in equations (8) and (10) have been obtained.

For case 1 (A before B) there will result the following rules for the auxiliary network:

$$H_{2a}(\omega_1,\omega_2) = -\frac{H_{1a}(\omega_1)\cdot H_{1a}(\omega_2)\cdot H_{2b}(\omega_1,\omega_2)}{H_{1b}(\omega_1+\omega_2)}; \quad (7)$$

$$H_{3a}(\omega_1,\omega_2,\omega_3) = \quad (8)$$

$$-\frac{H_{1a}(\omega_1)\cdot H_{1a}(\omega_2)\cdot H_{1a}(\omega_3)\cdot H_{3b}(\omega_1,\omega_2,\omega_3)}{H_{1b}(\omega_1+\omega_2+\omega_3)} -$$

$$\frac{\frac{1}{3}\sum_{\xi\eta\delta}^{3} H_{1a}(\omega_\xi)\cdot H_{2a}(\omega_\eta,\omega_\delta)\cdot H_{2b}(\omega_\xi,\omega_\eta+\omega_\delta)}{H_{1b}(\omega_1+\omega_2+\omega_3)};$$

For case 2 (A behind B) there will result the following rules for the auxiliary network:

$$H_{2a}(\omega_1,\omega_2) = -\frac{H_{1a}(\omega_1+\omega_2)\cdot H_{2b}(\omega_1,\omega_2)}{H_{1b}(\omega_1)\cdot H_{1b}(\omega_2)}; \quad (9)$$

$$H_{3a}(\omega_1,\omega_2,\omega_3) = \quad (10)$$

$$-\frac{H_{1a}(\omega_1+\omega_2+\omega_3)\cdot H_{3b}(\omega_1,\omega_2,\omega_3)}{H_{1b}(\omega_1)\cdot H_{1b}(\omega_2)\cdot H_{1b}(\omega_3)} -$$

$$\frac{\frac{1}{3}\sum\limits_{\xi,\eta,\delta}^{3} H_{1b}(\omega_\xi) \cdot H_{2b}(\omega_\xi,\omega_\delta) \cdot H_{2a}(\omega_\xi,\omega_\eta + \omega_\delta)}{H_{1b}(\omega_1) \cdot H_{1b}(\omega_2) \cdot H_{1b}(\omega_3)};$$

Figure 2:
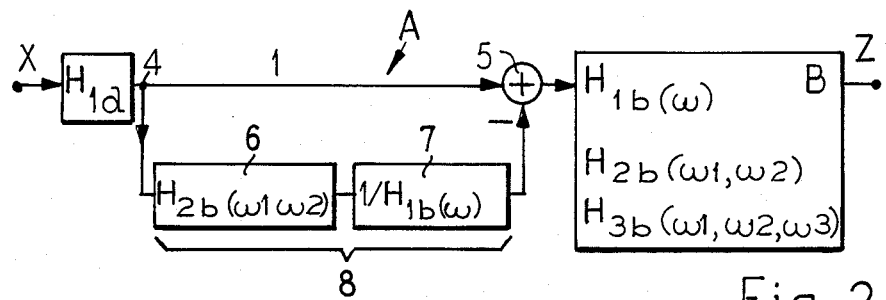
FIGS. 2 and 3 show the basic circuit diagram of a network for compensating exclusively quadratic non-linearities of an amplifier.
Figure 3:
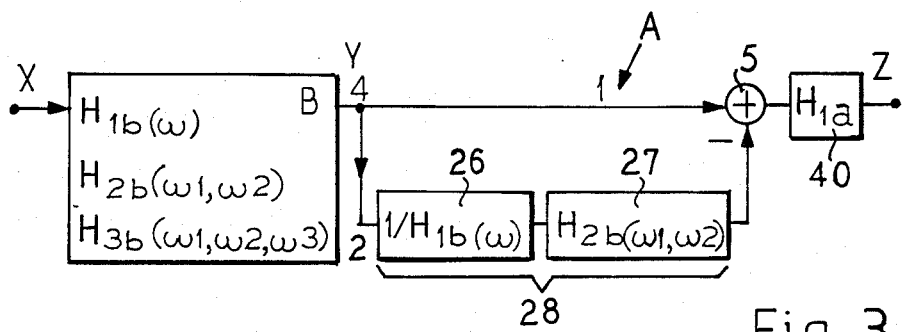

These equations (7), (8), (9) and (10) can be converted to corresponding electrical block circuits. FIG. 2 shows the conversion of equation (7), in which it results from the component ($\omega_1 + \omega_2$) of the denominator that the circuit component 7 having an inverse linear transverse function must be provided behind the circuit component 6 having quadratic non-linearity. FIG. 3 shows the corresponding realization of equation (9), in which it is again apparent from the denominator of this equation that in this case the inverse-linear component 26 must be provided before the quadratic circuit component 27.

Figure 4:
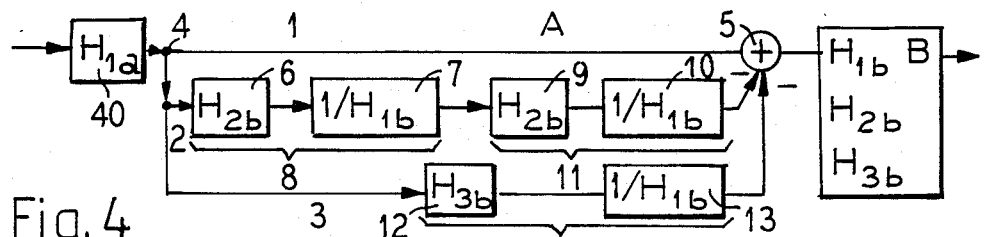
FIGS. 4 and 5 show a network for compensating exclusively cubic non-linearities of an amplifier.
Figure 5:
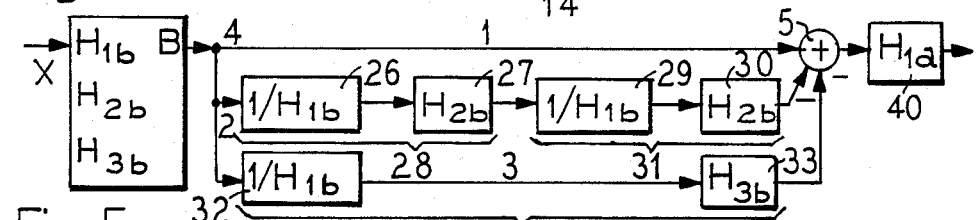

The FIGS. 4 and 5 each illustrate the realization of the equations (8) and (10), respectively; as shown in FIG. 4 the second branch 2 is composed of two cascade-connected cascade circuits 8 and 11 each of which is composed of a circuit component 6 and 9, respectively, with quadratic transfer function and a succeeding circuit component 7 and 10, respectively, with inverse-linear transfer function. Branch 3 comprises a cascade circuit 14 composed of the cascade connection of a circuit component 12 with cubic transfer function and a succeeding circuit component 13 with inverse-linear transfer function. The solution for case 2 according to FIG. 5 has two cascade-connected cascade circuits 28 and 31 in branch 2, branch 3 comprises a cascade circuit 34, wherein the cascade circuits each are composed of circuit components 27, 30 with quadratic transfer function and a circuit component 33 with cubic transfer function, respectively, but in this case with respective preceding circuit components 26, 29, 32 each having an inverse-linear transfer function. The outputs of the branches 2 and 3 are each inversely supplied (i.e, supplied negated) to the adder 5 (indicated by the minus sign).

Figure 6:
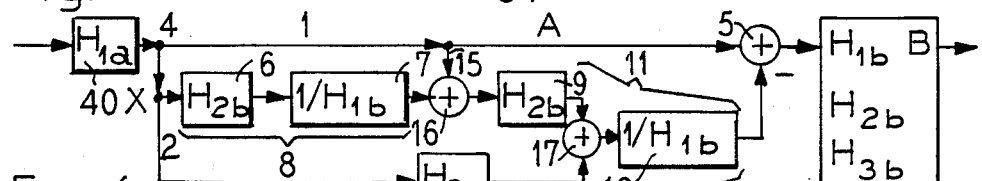
FIGS. 4A, 5A and 6 to 11 show networks for compensating both the quadratic and the cubic non-linearities of an amplifier.
Figure 7:
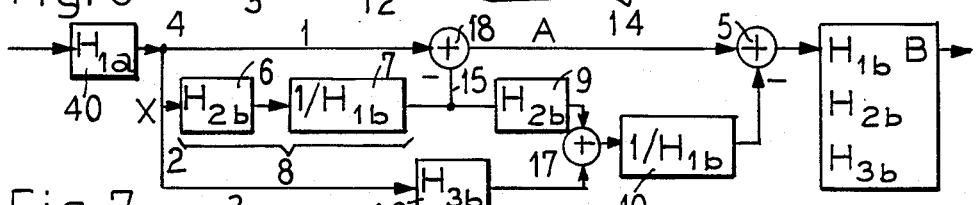

The circuit diagrams 6 to 9 shows the combined realization of equations (7) to (10), i.e. for the compensation of both quadratic and cubic distortions. The circuit diagrams of FIGS. 6 to 9 substantially corresponds to those of FIGS. 4 and 5, but to simplify the design the circuit components 10, 13 and 26, 32 separately illustrated in FIGS. 4 and 5 for both branches 2 and 3 have been combined in this case to form a single circuit component 10 (FIGS. 6 and 7) and 26 (FIGS. 8 and 9), respectively. In FIGS. 6 and 7 an additional adder 17 is also provided for combining the output signals from the circuit components 9 and 12. Of course, the same combination could be used for the basic circuit diagrams according to FIGS. 4 and 5.

Figure 4A:
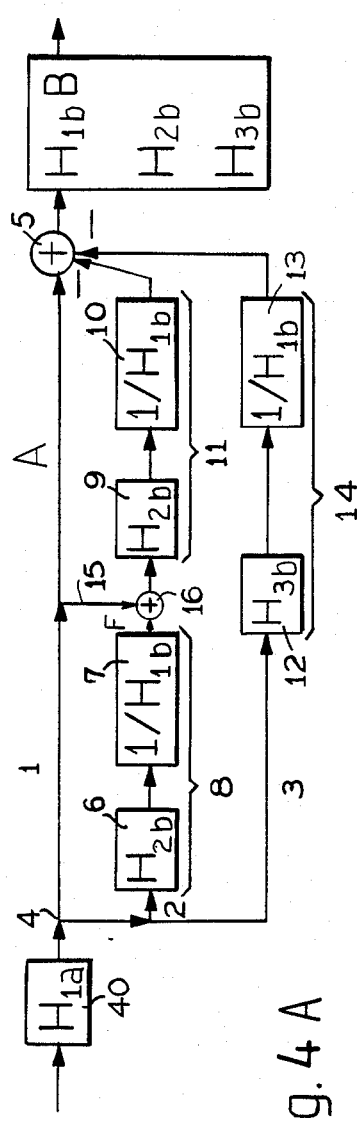
Figure 5A:
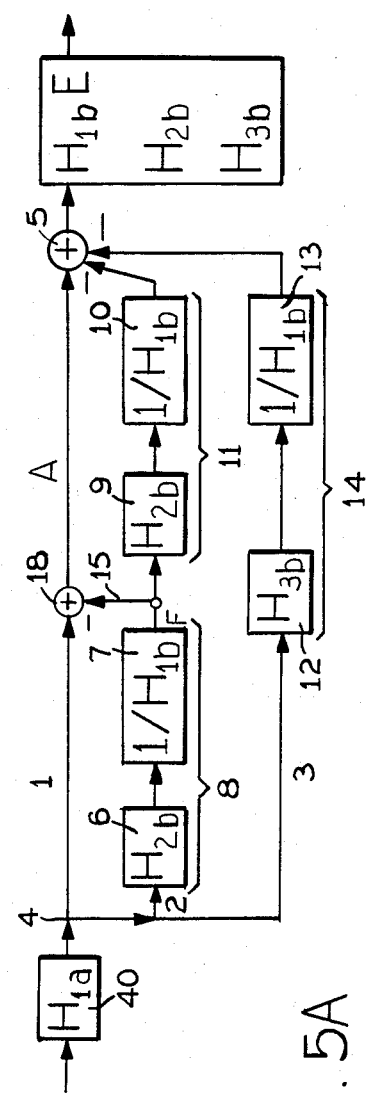

FIGS. 4A and 5A show the "intermediate" step in the transition from FIG. 4 to FIGS. 6 and 7, without simplification by combining components.

Figure 8:
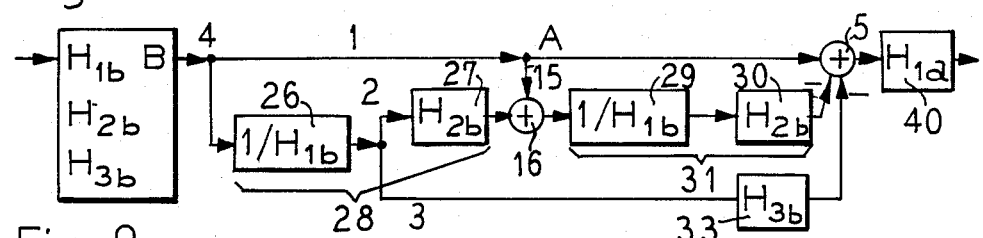
Figure 9:
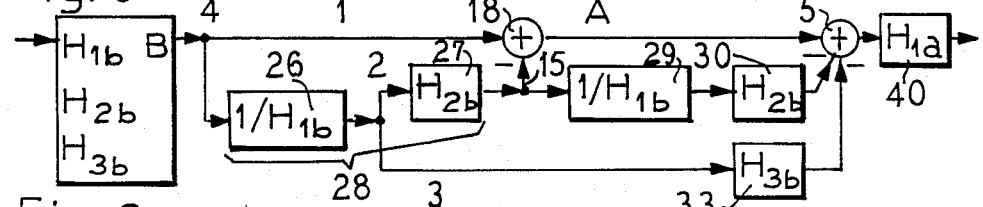

For the additional quadratic compensation the basic networks according to FIGS. 6 and 9 also comprise a cross connection 15 between branch 1 and branch 2 by which either the output signal of the first cascade circuit 8 has the input signal X from the branch point 4 linearly added thereto with the amplification factor 1 (X+F), as illustrated in FIGS. 6 and 8 with the additional adder 16 before the second cascade circuit 11 and 31, respectively, or the output signal F of said first cascade circuit 8 and 28, respectively, is subtracted through an additional adder 18 in the first branch 1 from the input signal X of the branch point (X−F), as indicated again by the minus sign of the adder 18.

As will be apparent from equation (1), the non-linear components *$H_{2b}$ and *$H_{3b}$ do not, as is sometimes common in block diagrams, contain only multiplicative weight functions but they also contain convolution operations according to equation (1). This is one of the reasons why the generally known rules for the shifting of blocks through branch points and adders as well as the exchange of blocks (cf. FIG. 19) must not be applied to the non-linear circuit components. By the structures for the auxiliary network according to FIGS. 2 to 9 arrangements have been found which represent the minimum required design effort for exactly compensating the frequency-dependent non-linearity within a broad frequency range. Of course, for the linear subsystems $1/H_{1b}$ and $H_{1a}$ the above-mentioned rules for the modification of block diagrams do apply. It is therefore possible by shifting and exchanging the linear blocks to achieve a variety of possible solutions which, however, are all based on the structures illustrated in FIGS. 2 to 9.

Figure 11:
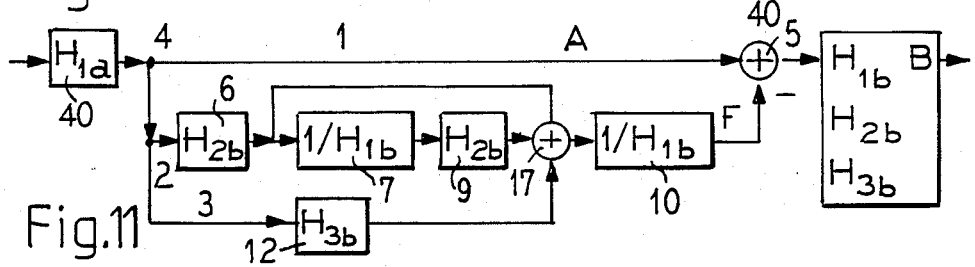

An example of such a modification is the above-mentioned combination of the circuit components 10, 13 and 26, 32, which in FIGS. 4 and 5 are separately illustrated in the branches 2 and 3, to form a single circuit component 10 and 26, respectively, common to both branches 2 and 3. A further modification for the combined quadratic and cubic compensation is illustrated in FIG. 11. Here, the requirement (X−F) described with reference to FIG. 7 is satisfied by supplying the output signal of the circuit component 6 to the adder 17, whereby the output signal F is again formed at the output of the circuit component 10, said output signal F being then subtracted from the input signal X in the adder 5.

From equations (7) and (9) it is apparent that also an additional circuit component having a random linear transfer function $H_{1a}(\omega)$ can be provided before or behind the auxiliary network. This is respectively indicated in the embodiments of FIGS. 2 to 9 and 11 by a corresponding additional circuit component 40. In this respect FIG. 10 illustrates a further modification of the basic network according to FIG. 9, where a separate linear circuit component 40 is provided in each of the branches 1, 2, 3.

Figure 10:
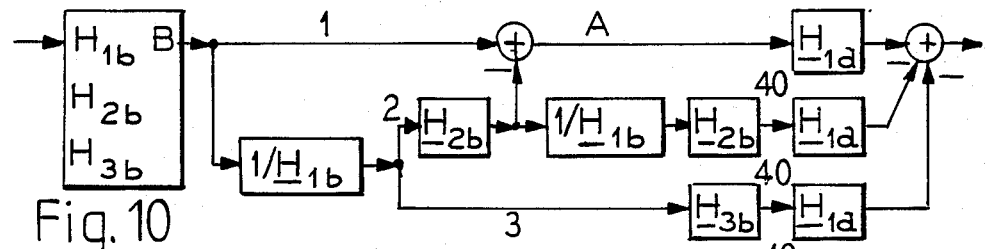

It is apparent from the basic networks according to FIGS. 2 to 9 and the modifications according to FIGS. 10 and 11, respectively, that the auxiliary network A may be designed very simply and clearly from circuit components which need only be selected and dimensioned so as to respectively exhibit a transfer behavior identically corresponding to the compensated amplifier B. To this end it is merely necessary that the linear, quadratic or cubic component of the frequency-dependent transfer function $H_{1b}(\omega)$, $H_{2b}(\omega_1, \omega_2)$ or $H_{3b}(\omega_1, \omega_2, \omega_3)$ of the compensated amplifier B is either calculated broadband-fashion or at least in the transmission frequency range of the broadband amplifier B in the known way or is determined directly by measurement at the amplifier B. With these correspondingly calculated or measured values it is then possible to design the individual circuit components in a simple way from components exhibiting said transfer functions and to combine these components as indicated by the basic circuits of the invention.

There are various possibilities for designing and implementing the circuit components of the auxiliary network A on the basis of the measured or calculated values of the amplifier B. Because of the required linearity, the circuit components with inverse-linear transfer function $1/H_{1b}(\omega)$ are best implemented by passive circuit elements. A further possibility is the implementation with amplifier circuits which in their turn are linearized by known compensation measures.

Figure 12:
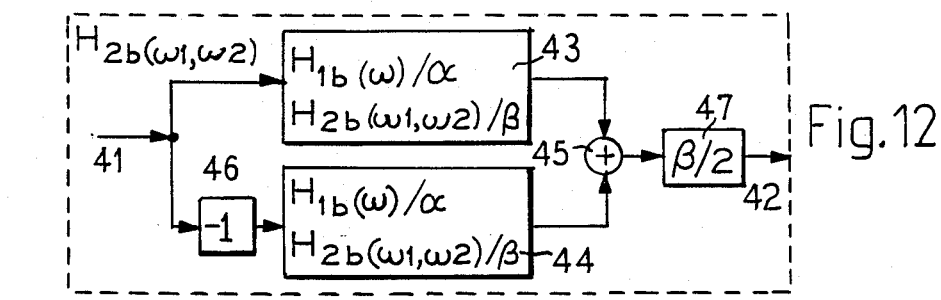
FIGS. 12 to 14 show the possibilities for realizing the circuit components with quadratic or cubic transfer functions used in the auxiliary network of FIGS. 1 to 11.
Figure 13:
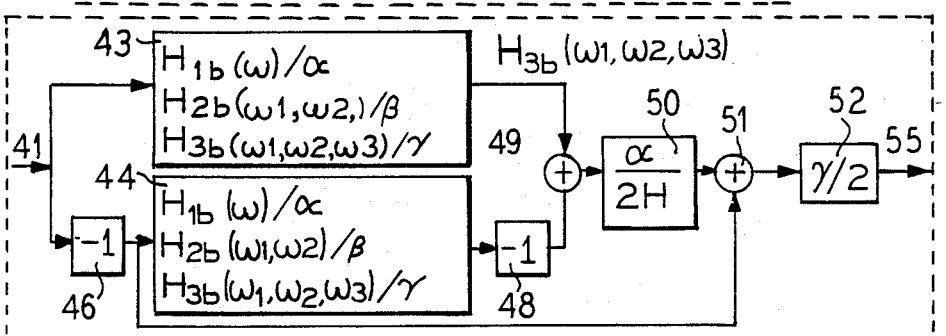

The circuit components with quadratic transfer function $H_{2b}(\omega_1, \omega_2)$ are preferably implemented in accordance with FIG. 12, while the circuit components with cubic transfer function $H_{3b}(\omega_1, \omega_2, \omega_3)$ are best implement in accordance with FIG. 13.

For a system which is energized by the input spectrum $-X(\omega)$ there results the following output spectrum $Y^-(\omega)$ according to equation (1):

$$Y^-(\omega) = -H_1(\omega)X(\omega) + H_2(\omega_1,\omega_2)\cdot(X(\omega) \\ *X(\omega)) - H_3(\omega_1,\omega_2,\omega_3)\cdot(X(\omega)*X(\omega)*X(\omega))\ldots, \quad (11)$$

This means that the components with an odd degree of the output spectrum are inverted. By addition of the equations (1) and (11) the quadratic component of the transfer function of the considered system is obtained, by subtraction of equations (1) and (11) and subsequent further subtraction of the input spectrum $X(\omega)$ the cubic component of the transfer function of the considered system is obtained. The block circuits shown in FIGS. 12, 13 and 14 operate on this principle. In this connection the non-linear components of the transfer functions of the blocks 43 and 44 have the same frequency-dependency as the non-linear transfer function of the compensated amplifier B itself. This includes the provision that networks may be incorporated in blocks 43 and 44 whose transfer behaviour is similar to that of the compensated amplifier B, for instance by implementing them in an identical way. In case the quadratic or cubic component may be neglected for an amplifier to be compensated, it will be sufficient to implement in one of the blocks 43 or 44 only the linear component of the frequency-dependent non-linear transfer function of the respective other block 44 or 43. The blocks 47 and 52 are necessary so that constant factors, by which the quadratic or cubic component of the transfer functions of the blocks 43 and 44 differ from those of the compensated amplifier B, can be balanced. If amplifiers are provided in the blocks 43 and 44 whose design is similar to that of the compensated amplifier B, the blocks 47 and 52 must respectively exhibit a linear transfer function of the order of $+\frac{1}{2}$. This may be realized in a very simple way by means of voltage or current dividers.

As an example, the network shown in FIG. 12 for realizing $H_{2b}(\omega_1, \omega_2)$ has two amplifiers 43 and 44 connected in parallel between the input 41 and an adder 45, an inverter 46 being provided before the one amplifier 44. The factors $1/\alpha$ and $1/\beta$ indicate that the elements of the amplifiers 43 and 44 are not identical but that the linear component $H_{1b}(\omega)$ differs by the factor $1/\alpha$ and the quadratic component $H_{2b}(\omega_1, \omega_2)$ differs by the factor $1/\beta$. The factor $\alpha$ is cancelled out in this network and may be neglected. But the factor $1/\beta$ must be considered correspondingly in the succeeding network 47 and must be compensated. Therefore the circuit 47 weights the output signal of the adder 45 with the factor $\beta/2$. The factors $\alpha$ and $\beta$ may be positive or negative numerical values other than 1. When the amplifiers 43, 44 are of identical structure with the amplifier B, these factors are 1.

In case the cubic distortions of the amplifier B can be neglected, it will suffice to realize in one of the two amplifiers 43 or 44 only the linear component of the transfer function of the respective other amplifier 44 or 43, respectively. In this case the circuit 47 amplifies only by the factor $\beta$.

FIG. 13 illustrates a network for implementing the network component $H_{3b}(\omega_1, \omega_2, \omega_3)$. Here, too, two identical amplifiers 43, 44 are used which are connected in parallel, respective inverters 46 and 48 being provided before and behind the amplifier 44. The aggregate signal added in the adder 49 is supplied to a network component 50 exhibiting a transfer function $\alpha/2H_{1b}(\omega_1, \omega_2)$. The output signal from the first inverter 46 is added in an adder 51 with the output signal of said network component 50 and is finally weighted with a factor $\gamma/2$ in a network component 52, $1/\gamma$ being the factor by which the cubic component of the amplifiers 43, 44 deviates from that of the amplifier B. If the quadratic distortions of the amplifier B may be neglected, it will suffice with this circuit according to FIG. 13 to implement in one of the two amplifiers 43 or 44 only the linear component of the frequency-dependent transfer function of the respective outer amplifier 44 or 43. In this case the aggregate signal should only be weighted with the factor $\gamma$ in the circuit 52.

Figure 14:
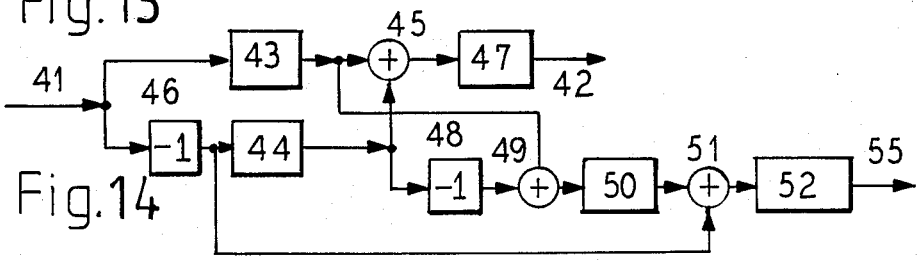

Finally, FIG. 14 illustrates the combined implementation of $H_{2b}(\omega_1, \omega_2)$ and $H_{3b}(\omega_1, \omega_2, \omega_3)$ which is composed of the circuit components shown in FIGS. 12 and 13.

Figure 15:
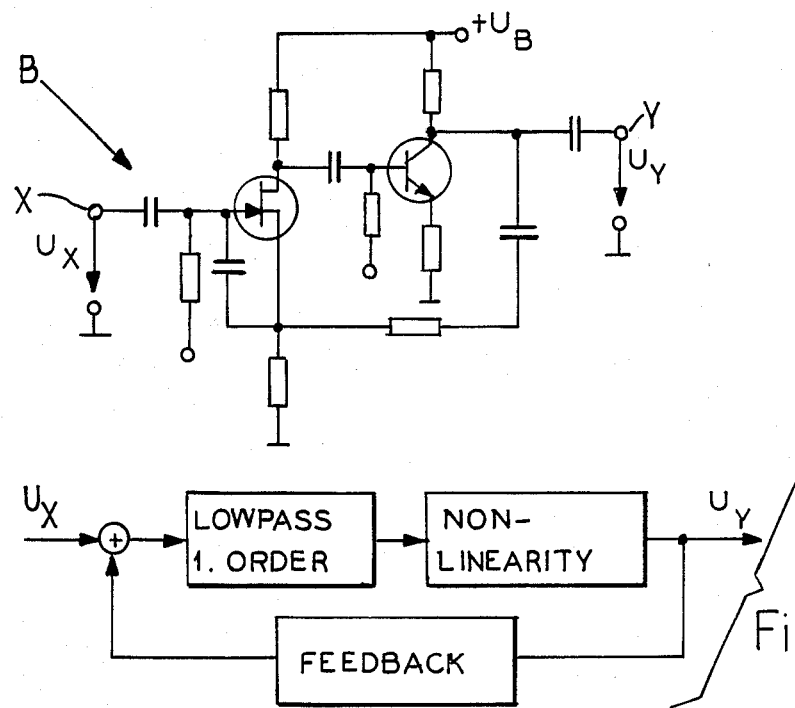
FIGS. 15 and 16 show the basic circuit diagram of a transistor amplifier to be compensated, inclusive of the associated equivalent circuit diagram and the associated measured or calculated frequency-dependent non-linear transfer function.
Figure 16:
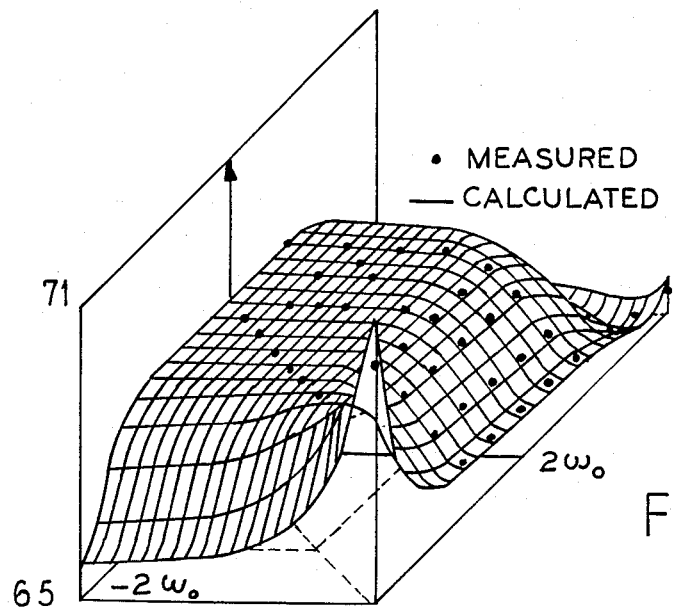
Figure 17:
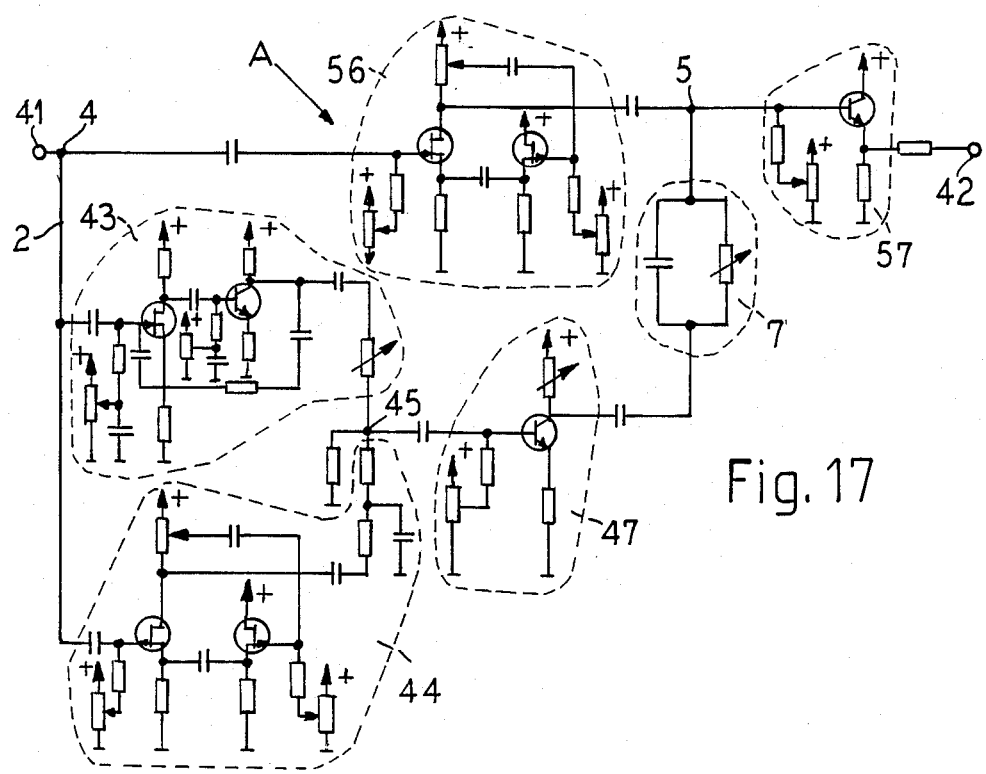
FIG. 17 shows an embodiment of the structure of an auxiliary network for compensating an amplifier such as shown in FIG. 15.

The FIGS. 15 to 17 illustrate a practical embodiment for implementing an auxiliary network A for compensating the quadratic distortions of an amplifier B, said embodiment being designed on the above-mentioned basic principle of the invention. For this practical embodiment an amplifier B is chosen which is composed of field-effect transistors according to FIG. 15 and which exhibits the characteristic frequency-dependent non-linear transfer behaviour of a negative feedback-type, grade-1 low-pass amplifier, as will be apparent from the equivalent circuit of FIG. 15. By measurement of the frequency-dependent amplification and of the frequency-dependent intermodulation behaviour of this amplifier the transfer functions $H_{1b}(\omega)$ and $H_{2b}(\omega_1, \omega_2)$ were approximately determined. FIG. 16 illustrates the second-order intermodulation rejection in dependency on the frequency as determined, on the one hand, by measurement according to the intermodulation technique and, on the other hand, determined as known per se by model calculation. FIG. 16 shows that this respective determination of the parameters by calculation and by measurement has a relatively high degree of conformity in practical applications.

Since for the sake of simplicity only the compensation of the quadratic distortions is required for the practical embodiment, a basic network according to FIG. 2 is used as the auxiliary network A for compensating the amplifier according to FIG. 15, said basic network comprising components according to FIG. 12.

As shown in FIG. 17, an amplifier 43 is used which has the same circuit design as the amplifier B, although said amplifier 43 is operated at small quiescent currents. Although quantitatively it thereby exhibits a transfer behaviour which differs from that of the amplifier B, it still exhibits nearly the same frequency dependency of the transfer behaviour. The amplifier 44 is constituted by an amplifier circuit which is linearized by feedback compensation and the amplification of which may be varied without the risk of a substantial deterioration of the compensation quality. In this way the auxiliary network may be balanced. Therefore the simplification mentioned in conjunction with FIG. 12 is assumed, viz. that cubic distortions of the amplifier B may be neglected and therefore only the linear component of the transfer function of the other amplifier 43 is implemented in the amplifier 44.

In this embodiment, the branch 1 has an additional buffer amplifier 56 provided therein for decoupling purposes, whereby the operation of the basic network is not affected; this buffer amplifier 56 may even be a linear inverter because in the basic network according to FIG. 2 (but not in the other basic networks) the input signal X may also be supplied to the adder 5 in inverted form, as will be apparent from the above equations.

The circuit 47 is implemented by a single transistor which is operated at a high closed-circuit current and is highly degenerative. Therefore it has only little non-linearity. Moreover, it is only driven by small signals, viz. the extracted distortion products, so that its non-linearity is hardly effective.

The inverse linear network component $1/H_{1b}(\omega)$ is implemented in a passive way by an RC network in conjunction with the adjacent resistors. Circuit 57 is but an impedance transformer.

Comparative measurements between a network according to the invention as shown in FIG. 17 and a known auxiliary network as shown in FIG. 1, which was composed of similar network components, have shown that with a network according to the invention good linearization of the amplifier B is achieved in a broad frequency band both at low and at intermediate and high frequencies, whereas with a known system this is possible only in a very narrow band for low frequencies.

Figure 18:
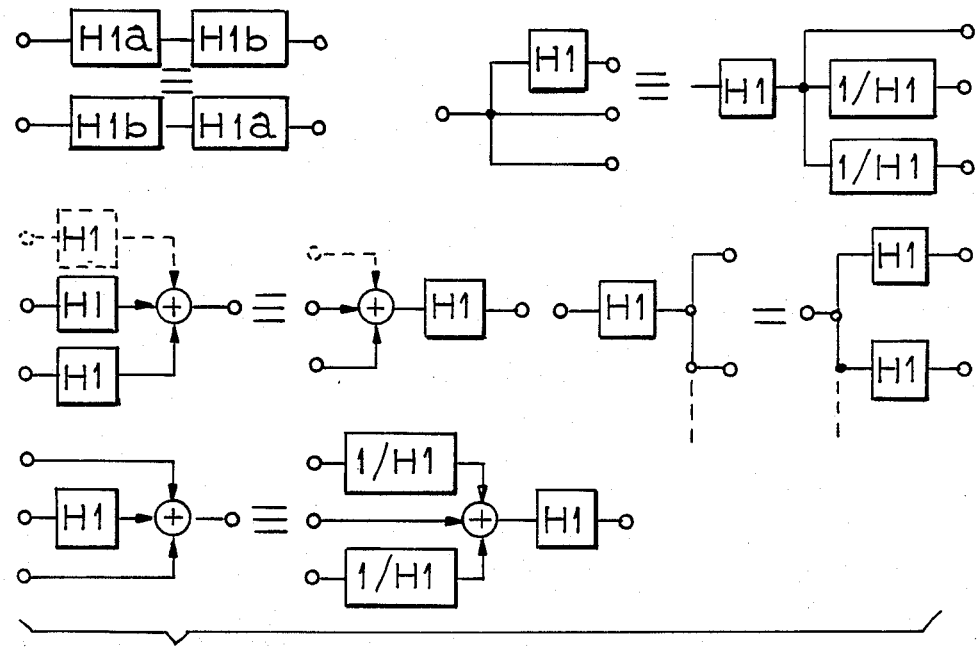
FIG. 18 shows schematically the known rules for interchanging and shifting linear circuit components through branch points and adders of the type useful in the auxiliary network according to the invention.

FIG. 18 shows schematically the known rules for interchanging linear network components or for shifting the same via branch points or adders; these rules may also be applied in respect of the linear network components of the basic networks of the invention, but they may not be applied in respect of the quadratic or cubic network components.

We claim:

1. An arrangement for compensating the non-linearity of an amplifier having a frequency-dependent transfer function, an input and an output, said arrangement including an auxiliary network having an input for receiving an input signal, and an output connected to the input of the amplifier, and comprising:
   first and second branches, said first branch connected between said input and said output of said auxiliary network for linearly transferring the input signal to said output of said auxiliary network;
   an adder including a first input, a second input, and an output, said first input connected to said input of said auxiliary network via the first branch, and said output connected to the input of said amplifier;
   said second branch including means having an input connected to the input of the auxiliary network and an output connected to said second input of said adder for supplying the input signal to said adder with a negated quadratic form; and
   said first means having at least one cascade network including first and second circuit components, said first circuit component preceding said second circuit component, said first circuit component having a transfer function corresponding to a quadratic component of the frequency-dependent transfer function of the amplifier, and said second circuit component having a transfer function corresponding to an inverse linear component of the frequency-dependent transfer function of the amplifier.

2. An arrangement for compensating the non-linearity of an amplifier having a frequency-dependent transfer function, an input and an output, said arrangement including an auxiliary network having an input for receiving an input signal, and an output connected to the input of the amplifier and comprising:
   first and second branches, said first branch connected between said input and said output of said auxiliary network for linearly transferring the input signal to said output of said auxiliary network;
   an adder including a first input, a second input, and an output, said first input connected via said first branch to said input of said auxiliary network, said output connected to the input of said amplifier;
   said second branch including first means having an input connected to the input of the auxiliary network and an output connected to said second input of said adder for supplying the input signal to said adder with a negated cubic form; and
   said first means having at least one cascade network including first and second circuit components, said first circuit components preceding said second circuit component, said first circuit component having a transfer function corresponding to a cubic component of the frequency-dependent transfer function of the amplifier, and said second circuit component having a transfer function corresponding to an inverse linear component of the frequency-dependent transfer function of the amplifier.

3. An arrangement for compensating the non-linearity of an amplifier having a frequency-dependent transfer function, an input and an output, said arrangement including an auxiliary network having an input for receiving an input signal, and an output connected to the input of the amplifier, and said auxiliary network comprising:
   first, second and third branches, said first branch connected between said input and said output of said auxiliary network for linearly transferring the input signal to said output of said auxiliary network;
   an adder including a first input, a second input, a third input and an output, said first input connected to said input of said auxiliary network via said first branch, and said output connected to the input of said amplifier;
   said second branch including first means having an input connected to the input of the auxiliary network and an output connected to said second input of said adder for supplying the input signal to said adder with a negated quadratic form;
   said first means having at least one cascade network including first and second circuit components, said first circuit component preceding said second circuit component, said first circuit component having a transfer function corresponding to a quadratic component of the frequency-dependent transfer function of the amplifier, and said second circuit component having a transfer function corresponding to an inverse linear component of the frequency-dependent transfer function of the amplifier;
   said third branch including second means having an input connected to the input of said auxiliary network and an output connected to said third input of said adder for supplying the input signal to said adder with a negated cubic form; and said second means having at least one cascade network including third and fourth circuit components, said third circuit component preceding said fourth circuit component, said third circuit component having a transfer function corresponding to a cubic component of the frequency-dependent transfer function of said amplifier, and said fourth circuit component having a transfer function corresponding to said inverse linear component of the frequency-dependent transfer function of said amplifier.

4. An arrangement for compensating the non-linearity of an amplifier having a frequency-dependent transfer function, an input and an output, said arrangement including an auxiliary network having an input connected to said output of said amplifier, and an output, said auxiliary network comprising:

first and second branches, said first branch connected between said input and said output of said auxiliary network for linearly transferring the input signal to said output of said auxiliary network;

an adder including a first input, a second input, and an output, said first input connected to said input of said auxiliary network via said first branch, and said output providing the compensation output of said amplifier;

said second branch including first means having an input connected to the input of the auxiliary network and an output connected to said second input of said adder for supplying the input signal to said adder with a negated quadratic form; and said first means having at least one cascade network including first and second circuit components, said first circuit component following said second circuit component, said first circuit component having a transfer function corresponding to a quadratic component of the frequency-dependent transfer function of the amplifier, and said second circuit component having a transfer function corresponding to an inverse linear component of the frequency-dependent transfer function of the amplifier.

5. An arrangement for compensating the non-linearity of an amplifier having a frequency-dependent transfer function, an input and an output, said arrangement including an auxiliary network having an input connected to said output of said amplifier, and an output, said auxiliary network comprising:

first and second branches, said first branch connected between said input and said output of said auxiliary network for linearly transferring the input signal to said output of said auxiliary network;

an adder including a first input, a second input, and an output, said first input connected to said input of said auxiliary network via said first branch, and said output providing the compensated output signal of said amplifier;

said second branch including first means having an input connected to the input of the auxiliary network and an output connected to said second input of said adder for supplying the input signal to said adder with a negated cubic form; and said first means having at least one cascade network including first and second circuit components, said first circuit component following said second circuit component, said first circuit component having a transfer function corresponding to a cubic component of the frequency-dependent transfer function of the amplifier, and said second circuit component having a transfer function corresponding to an inverse linear component of the frequency-dependent transfer function of the amplifier.

6. An arrangement for compensating the non-linearity of an amplifier having a frequency-dependent transfer function, and input and an output, said arrangement including an auxiliary network having an input connected to said output of said amplifier, and an output, said auxiliary network comprising:

first, second and third branches, said first branch connected between said input and said output of said auxiliary network for linearly transferring the input signal to said output of said auxiliary network;

an adder including a first input, a second input a third input, and an output, said first input connected via said first branch to said input of said auxiliary network, said output providing the compensated output of said amplifier;

said second branch including first means having an input connected to the input of the auxiliary network and an output connected to said second input of said adder for supplying the input signal to said adder with a negated quadratic form;

said first means having at least one cascade network including first and second circuit components, said first circuit component following said second circuit component, said first circuit component having a transfer function corresponding to a quadratic component of the frequency-dependent transfer function of the amplifier, and said second circuit component having a transfer function corresponding to an inverse linear component of the frequency-dependent transfer function of the amplifier;

said third branch including said means having an input connected to the input of said auxiliary network and an output connected to said third input of said adder for supplying the input signal to said adder with a negated cubic form; and said second means having at least one cascade network including third and fourth circuit components, said third circuit component following said fourth circuit component, said third circuit component having a transfer function corresponding to a cubic component of the frequency-dependent transfer function of said amplifier, and said fourth circuit component having a transfer function corresponding to said inverse linear component of the frequency-dependent transfer function of said amplifier.

7. In an arrangement for compensating for the non-linearity of an amplifier having a frequency-dependent transfer function, an auxiliary network connected to said amplifier, said auxiliary network having an input and an output and comprising:

a first branch connected between said input and said output for linearly transferring a signal from said input to said output;

an adder having a first input, at least one of a second input and a third input, and an output providing a signal for compensating for said non-linearity of said amplifier;

said first branch connected to said first input of said adder;

at least one of a second branch and a third branch;

said second branch including first means having an input connected to the input of the auxiliary network and an output connected to said second input of said adder for supplying the input signal to said adder with a negated quadratic form;

said first means having at least one cascade network including first and second circuit components, said first circuit component having a transfer function corresponding to a quadratic component of the frequency-dependent transfer function of the amplifier, and said second circuit component having a transfer function corresponding to an inverse linear component of the frequency-dependent transfer function of the amplifier;

said third branch including second means having an input connected to the input of said auxiliary network and an output connected to the third input of said adder for supplying the input signal to said adder with a negated cubic form; and said second means having at least one cascade network including third and fourth circuit components, said third circuit component having a transfer function corresponding to a cubic component of the frequency-dependent transfer function of said amplifier, and said fourth circuit component having a transfer function corresponding to said inverse linear component of the frequency-dependent transfer function of said amplifier.

8. An arrangement as claimed in claim 7, wherein said amplifier has a transmission frequency band and wherein said transfer function of said first circuit component is the same as the transfer function of said amplifier over the entirety of said transmission frequency band.

9. An arrangement as claimed in claim 8, wherein said first circuit component has an input and an output and comprises:

first and second sub-components each having a transfer function corresponding to said quadratic component of the frequency-dependent transfer function of said amplifier, each of said first and second sub-components having an input and an output;

means for connecting said inputs of said first and second sub-components to said input of said first circuit component, including means for inverting one of said sub-component inputs;

a further adder having first and second inputs respectively connected to said outputs of said first and second sub-components, and having an output; and a weighting means connected to said output of said further adder for weighting the output of said adder by a factor of one-half, and having an output forming said output of said first circuit component.

10. An arrangement as claimed in claim 9, wherein said transfer function of each of said first and second sub-components has a factor of a constant multiplied by said quadratic component of said frequency-dependent transfer function, and wherein said weighting means weights said output of said adder by a factor of one-half multiplied by the reciprocal of said constant factor.

11. An arrangement as claimed in claim 8, wherein said first circuit component has an input and an output and comprises:

a first sub-component having a transfer function having only a linear component corresponding to the linear component of the frequency-dependent transfer function of said amplifier, said first sub-component having an input and an output;

a second sub-component having a transfer function corresponding to said quadratic component of the frequency-dependent transfer function of said amplifier, said second sub-component having an input and an output;

means for connecting said inputs of said first and second sub-components to said input of said first circuit component, including means for inverting one of said sub-component inputs; and a further adder having first and second inputs respectively connected to said outputs of said first and second sub-components, and having an output connected to the output of said first circuit component.

12. An arrangement as claimed in claim 11, wherein said transfer function of said second sub-component includes a factor of a constant multiplied by said quadratic component of the frequency-dependent transfer function of said amplifier, and wherein said first circuit component further comprises: a weighting means connected between the output of said further adder and the output of said first circuit component for weighting the output of said adder by a factor which is reciprocal of said constant factor in said transfer function of said second sub-component.

13. An arrangement as claimed in claim 8, wherein said third circuit component has an input and an output and comprises:

first and second sub-components each having a transfer function corresponding to said cubic component of the frequency-dependent transfer function of said amplifier, each of said first and second sub-components having an input and an output;

means for connecting said inputs of said first and second sub-components to said input of said third circuit component, including first means for inverting one of said sub-component inputs;

a second adder having first and second inputs respectively connected to said outputs of said first and second sub-components, and having an output;

second means for inverting the output of the one of said sub-components having an input connected to said first means for inverting, said second means for inverting connected between said one sub-component and one of said inputs of said second adder;

a third sub-component having a tranfer function corresponding to the inverse of said linear component of the frequency-dependent transfer function of said amplifier, said third sub-component having an input connected to said output of said second adder, and having an output;

a third adder having a first input connected to said output of said third sub-component and a second input connected to the output of said first means for inverting, and having an output; and a weighting means having an input connected to the output of said third adder for weighting the output of said adder by a factor of one-half, and having an output forming said output of said third circuit component.

14. An arrangement as claimed in claim 13, wherein said transfer function of each of said first and second sub-components includes a factor of a constant multiplied by said quadratic component of the frequency-dependent transfer function of said amplifier, and wherein said weighting means weights the output of said adder by a factor of one-half multiplied by the reciprocal of said constant factor.

15. An arrangement as claimed in claim 8, wherein said third circuit component has an input and an output and comprises:
 a first sub-component element having a transfer function corresponding only to said linear component of said frequency-dependent transfer function of said amplifier, said first sub-component having an input and an output;
 a second sub-component having a transfer function corresponding to said cubic component of the frequency-dependent transfer function of said amplifier, said second sub-component having an input and an output;
 means for connecting said inputs of said first and second sub-components to said input of said third circuit component, including first means for inverting one of said sub-component inputs;
 a second adder having first and second inputs respectively connected to the outputs of said first and second sub-components, and having an output;
 second means for inverting the output of said one of said sub-components connected to said first means for inverting, said second means for inverting connected between the output of said one sub-component and one of the inputs of said second adder;
 a third sub-component having a transfer function corresponding to the inverse of said linear component of the frequency-dependent transfer function of said amplifier, said third sub-component having an input connected to the output of said second adder, and having an output; and
 a third adder having a first input connected to the output of said third sub-component, a second input connected to the output of said first means for inverting, and an output connected to the output of said third circuit component.

16. An arrangement as claimed in claim 15, wherein said transfer function of said second sub-component includes a factor of a constant multiplied by said cubic component of the frequency-dependent transfer function of said amplifier, and wherein said arrangement further comprises:
 a weighting means connected between said output of said third adder and said output of said third circuit component for weighting the output of said adder by a factor which is the reciprocal of said constant factor.

17. An arrangement as claimed in claim 7, wherein said amplifier has a transmission frequency band and wherein said transfer function of said third circuit component is the same as the transfer function of said amplifier over the entirety of said transmission frequency band.

18. An arrangement as claimed in claim 7, wherein said amplifier has an input and wherein said output of said adder forms said output of said auxiliary network, said output of said auxiliary network being connected to said input of said amplifier, and wherein said first circuit component precedes said second circuit component in said cascade network of said first means, and wherein said third circuit component precedes said fourth circuit component in said cascade network of said second means.

19. An arrangement as claimed in claim 18, further comprising a circuit component having a random linear transfer function connected before said auxiliary network.

20. An arrangement as claimed in claim 7, wherein said amplifier has an output, and wherein said input of said auxiliary circuit is connected to said output of said amplifier, and wherein said first circuit component follows said second circuit component in said cascade network of said first means, and wherein said third circuit component follows said fourth circuit component in said cascade network of said second means.

21. An arrangement as claimed in claim 20, further comprising a circuit component having a random linear transfer function connected after said auxiliary network.

22. An arrangement as claimed in claim 7, wherein said first means has first and second cascade networks connected in series, each of said first and second cascade networks including a first circuit component having a transfer function corresponding to a quadratic component of the frequency-dependent transfer function of the amplifier, and a second circuit component having a transfer function corresponding to an inverse linear component of the frequency-dependent transfer function of the amplifier.

23. In an arrangement for compensating for the non-linearity of an amplifier having a frequency-dependent transfer function, an auxiliary network connected to said amplifier, said auxiliary network having an input and an output and comprising:
 a first branch connected between said input and said output for linearly transferring a signal from said input to said output;
 a first adder having first, second and third inputs, and an output for providing a signal for compensating for said non-linearity of said amplifier;
 said first branch connected to said first input of said adder;
 a second branch including first means having an input connected to the input of the auxiliary network and an output connected to said second input of said first adder for supplying the input signal to said first adder with a negated quadratic form;
 said first means having first and second cascade networks, each including first and second circuit components, said first circuit component having a transfer function corresponding to a quadratic component of the frequency-dependent transfer function of the amplifier, said second circuit component having a transfer function corresponding to an inverse linear component of the frequency-dependent transfer function of the amplifier;
 a third branch including second means having an input connected to the input of said auxiliary network and an output connected to the third input of said adder for supplying the input signal to said first adder with a negated cubic form;
 said second means having a third cascade network including third and fourth circuit components, said third circuit component having a transfer function corresponding to a cubic component of the frequency-dependent transfer function of said amplifier, and said fourth circuit component having a transfer function corresponding to said inverse linear component of the frequency-dependent transfer function of said amplifier; and
 a second adder connected in said second branch, said second adder having first and second inputs and an output, said first input of said second adder connected to said input of said auxiliary network via said first branch, said second input of said second adder connected to an output of said first cascade network, and said output of said second adder connected to an input of said second cascade network.

24. In an arrangement for compensating for the non-linearity of an amplifier having a frequency-dependent transfer function, an auxiliary network connected to said amplifier, said auxiliary network having an input and an output and comprising:

a first branch connected between said input and said output for linearly transferring a signal from said input to said output;

a first adder having first, second and third inputs, and an output for providing a signal for compensating for said non-linearity of said amplifier;

said first branch connected to said first input of said adder;

a second branch including first means having an input connected to the input of the auxiliary network and an output connected to said second input of said first adder for supplying the input signal to said first adder with a negated quadratic form;

said first means having first and second cascade networks, each including first and second circuit components, said first circuit component having a transfer function corresponding to a quadratic component of the frequency-dependent transfer function of the amplifier, said second circuit component having a transfer function corresponding to an inverse linear component of the frequency-dependent transfer function of the amplifier;

a third branch including second means having an input connected to the input of said auxiliary network and an output connected to the third input of said adder for supplying the input signal to said first adder with a negated cubic form;

said second means having a third cascade network including third and fourth circuit components, said third circuit component having a transfer function corresponding to a cubic component of the frequency-dependent transfer function of said amplifier, and said fourth circuit component having a transfer function corresponding to said inverse linear component of the frequency-dependent transfer function of said amplifier; and a second adder connected in said first branch, said second adder having first and second inputs and an output, said first input of said second adder connected to said input of said auxiliary network, said second input of said second adder being negated and connected to an output of said first cascade network in said second branch, and said output of said second adder connected to said first input of said first adder.

25. In an arrangement for compensating for the non-linearity of an amplifier having a frequency-dependent function, an auxiliary network having an output connected to an input of said amplifier, said auxiliary network having an input and comprising:

a first adder having a first input connected to said input of said auxiliary network, a negated second input, and an output forming said output of said auxiliary network providing a signal for compensating for said non-linearity of said amplifier;

a cascade network including first and second circuit components, said first circuit component having an input connected to said input of said auxiliary network and a transfer function corresponding to a quadratic component of the frequency-dependent transfer function of the amplifier, and said second circuit component following said first circuit component and having an output and a transfer function corresponding to an inverse linear component of the frequency-dependent transfer function of the amplifier;

a second adder having a first input connected to said input of said auxiliary network, a second input connected to said output of second circuit component, and an output;

a third circuit component having an input connected to the input of said auxiliary network, and output, and a transfer function corresponding to a cubic component of the frequency-dependent transfer function of said amplifier;

a fourth circuit component having an input connected to said output of said second adder, an output, and a transfer function corresponding to the quadratic component of the frequency-dependent transfer function of said amplifier;

a fifth circuit component having an input, an output connected to said second input of said first adder, and a transfer function corresponding to said inverse linear component of the frequency-dependent transfer function of said amplifier; and a third adder having a first input connected to said output of said fourth circuit component, a second input connected to said output of said third circuit component, and an output connected to said input of said fifth circuit component.

26. In an arrangement for compensating for the non-linearity of an amplifier having a frequency-dependent transfer function, said amplifier having an output, an auxiliary network connected to said output of said amplifier and comprising:

a first circuit component having a transfer function corresponding to the inverse linear component of the frequency-dependent transfer function of the amplifier, an input connected to said input of said auxiliary network,a and an output;

a first adder having a first input connected to said input of said auxiliary network, a negated second input, a negated third input, and an output forming said output of said auxiliary network and providing a signal for compensating for said non-linearity of said amplifier;

a second circuit component having an input connected to said output of said first circuit component, a transfer function corresponding to a quadratic component of said frequency-dependent transfer function corresponding to a quadratic component of said frequency-dependent transfer function of said amplifier, and an output;

a second adder having a first input connected to said output of said second circuit component, a second input connected to said input of said auxiliary network, and an output;

a cascade network including third and fourth circuit components said third circuit component having an input connected to said output of said second adder, a transfer function corresponding to an inverse linear component of said frequency-dependent transfer function of said amplifier, and an output, and said fourth circuit component following said third circuit component and having an output connected to said negated second input of said first adder, and a transfer function corresponding to said quadratic component of the frequency-dependent transfer function of said amplifier; and a fifth circuit component having an input connected to said output of said first circuit component, an output connected to said third input of said first adder, and a transfer function corresponding to a cubic component of said frequency-dependent transfer function of said amplifier.

27. In an arrangement for compensating for the non-linearity of an amplifier having a frequency-dependent transfer function, an auxiliary network having an input having an output connected to an input of said amplifier, and comprising:

a first adder having a first input, a negated second input, and a output forming said output of said auxiliary network and providing a signal for compensating for said non-linearity of said amplifier;

a cascade network including first and second circuit components, said first circuit component having an input connected to said input of said auxiliary network, a transfer function corresponding to a quadratic component of said amplifier, and an output, and said second component having an input connected to said output of said first circuit component, a transfer function corresponding to an inverse linear component of said transfer function of said frequency-dependent amplifier, and an output;

a second adder having a first input connected to said input of said auxiliary network, a negated second input connected to said output of said second circuit component, and an output connected to said first input of said first adder;

a third circuit component having an input connected to said output of said second circuit component, a transfer function corresponding to said quadratic component of said frequency-dependent transfer function of said amplifier, and an output;

a fourth circuit component having an input connected to said input of said auxiliary network, a transfer function corresponding to a cubic component of said frequency-dependent transfer function of said amplifier, and an output;

a third adder having a first input connected to said output of said output of said third circuit component, a second input connected to said output of said fourth circuit component, and an output; and a fifth circuit component having an input connected to said output of said third adder, a transfer function corresponding to an inverse linear component of said frequency-dependent transfer function of said amplifier, and an output connected to said second input of said first adder.

28. In an arrangement for compensating of the non-linearity of an amplifier having a frequency-dependent transfer function, an auxiliary network having an input connected to an output of said amplifier, and comprising:

a first adder having a first input, a negated second input, a negated third input, and an output forming an output of said auxiliary network and providing a signal for compensating for said non-linearity of said amplifier;

a first circuit component having a input connected to said input of said auxiliary network, a transfer function corresponding to an inverse linear component of said frequency-dependent transfer function of said amplifier, and an output;

a second circuit component having an input connected to said output of said first circuit component, a transfer function corresponding to a quadratic component of said frequency-dependent transfer function of said amplifier, and an output;

a second adder having a first input connected to said input of said auxiliary network, a second input connected to said output of said second circuit component, and an output connected to said first input of said first adder;

a cascade network including third and fourth circuit components, said first circuit component having an input connected to said output of said second circuit component, a transfer function corresponding to said inverse linear component of said frequency-dependent transfer function. of said amplifier, and an output, said fourth circuit component having an input connected to said output of said third circuit component, a transfer function corresponding to said quadratic component of said frequency-dependent transfer function of said amplifier, and an output connected to second input of said first adder; and a fifth circuit component having an input connected to said output of said first circuit component, a transfer function corresponding to a cubic component of said frequency-dependent transfer function of said amplifier, and an output connected to said third input of said first adder.

* * * * *